United States Patent
Lin et al.

(10) Patent No.: US 10,170,455 B2
(45) Date of Patent: Jan. 1, 2019

(54) LIGHT EMITTING DEVICE WITH BUFFER PADS

(71) Applicant: PlayNitride Inc., Tainan (TW)

(72) Inventors: Tzu-Yang Lin, Tainan (TW); Yu-Hung Lai, Tainan (TW); Yu-Yun Lo, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 15/658,422

(22) Filed: Jul. 25, 2017

(65) Prior Publication Data

US 2017/0323873 A1    Nov. 9, 2017

Related U.S. Application Data

(63) Continuation-in-part of application No. 15/001,250, filed on Jan. 20, 2016.

(30) Foreign Application Priority Data

Sep. 4, 2015   (TW) .............................. 104129262 A

(51) Int. Cl.
*H01L 29/205* (2006.01)
*H01L 33/00* (2010.01)
(Continued)

(52) U.S. Cl.
CPC ............ *H01L 25/167* (2013.01); *H01L 24/95* (2013.01); *H01L 25/0753* (2013.01);
(Continued)

(58) Field of Classification Search
CPC ............. H01L 2924/0002; H01L 33/50; H01L 2933/0041; H01L 33/22; H01L 33/486; H01L 33/507; H01L 33/62
See application file for complete search history.

(56) References Cited

U.S. PATENT DOCUMENTS

2006/0163589 A1    7/2006  Fan et al.
2006/0261364 A1*   11/2006 Suehiro ................... H01L 33/56
                                                          257/100
(Continued)

FOREIGN PATENT DOCUMENTS

CN      101340752      1/2009
TW        471000       1/2002
(Continued)

OTHER PUBLICATIONS

"Office Action of Taiwan Counterpart Application," dated Apr. 26, 2016, p. 1-p. 7.

*Primary Examiner* — Ismail A Muse
(74) *Attorney, Agent, or Firm* — JCIPRNET

(57) ABSTRACT

A light emitting device includes a carrier, a plurality of light emitting diode chips and a plurality of buffer pads. Each light emitting diode chip includes a first type semiconductor layer, an active layer, a second type semiconductor layer, a via hole and a plurality of bonding pads. The via hole sequentially penetrates through the first type semiconductor layer, the active layer and a portion of the second type semiconductor layer. The first type semiconductor layer, the active layer, the second type semiconductor layer and the via hole define a epitaxial structure. The buffer pads are disposed between the carrier and the second type semiconductor layer, wherein the buffer pads is with Young's modulus of 2~10 GPa, the second bonding pad is disposed within the via hole to contact the second type semiconductor layer, and the epitaxial structure is electrically bonded to the receiving substrate through the bonding pads.

13 Claims, 17 Drawing Sheets

(51) Int. Cl.
- *H01L 25/16* (2006.01)
- *H01L 25/075* (2006.01)
- *H01L 33/38* (2010.01)
- *H01L 33/62* (2010.01)
- *H01L 33/44* (2010.01)
- *H01L 33/58* (2010.01)
- *H01L 23/00* (2006.01)
- *H01L 33/48* (2010.01)
- *H01L 27/12* (2006.01)
- *H01L 33/20* (2010.01)

(52) U.S. Cl.
CPC ........ *H01L 33/0079* (2013.01); *H01L 33/382* (2013.01); *H01L 33/44* (2013.01); *H01L 33/486* (2013.01); *H01L 33/58* (2013.01); *H01L 33/62* (2013.01); *H01L 27/1214* (2013.01); *H01L 33/20* (2013.01); *H01L 2933/0033* (2013.01); *H01L 2933/0066* (2013.01)

(56) References Cited

U.S. PATENT DOCUMENTS

| | | |
|---|---|---|
| 2007/0194330 A1 | 8/2007 | Ibbetson et al. |
| 2008/0298413 A1 | 12/2008 | Behfar et al. |
| 2009/0166659 A1 | 7/2009 | Edmond et al. |
| 2010/0019247 A1 | 1/2010 | Joichi et al. |
| 2010/0201280 A1 | 8/2010 | McKenzie et al. |
| 2010/0308347 A1 | 12/2010 | Yeh et al. |
| 2011/0233574 A1 | 9/2011 | Lee et al. |
| 2012/0049224 A1* | 3/2012 | Mizutani ............... H01L 27/153 257/98 |
| 2012/0146087 A1 | 6/2012 | Hsu |
| 2012/0193649 A1 | 8/2012 | Donofrio et al. |
| 2013/0026518 A1 | 1/2013 | Suh et al. |
| 2014/0110747 A1 | 4/2014 | Iwanaga et al. |
| 2014/0306261 A1* | 10/2014 | Im ............ H01L 33/62 257/99 |
| 2015/0062949 A1* | 3/2015 | Lee ............ H01L 27/156 362/520 |
| 2015/0124076 A1 | 5/2015 | Hersee |
| 2015/0243846 A1* | 8/2015 | Kwon ............ H01L 33/62 257/13 |
| 2015/0280063 A1* | 10/2015 | Wei ............ H01L 33/20 257/99 |
| 2015/0372196 A1* | 12/2015 | Matsumura ............ H01L 33/36 257/99 |
| 2016/0064630 A1* | 3/2016 | Castro ............ H01L 33/58 257/99 |
| 2016/0155892 A1 | 6/2016 | Li et al. |
| 2016/0233399 A1 | 8/2016 | Maki |
| 2016/0336487 A1* | 11/2016 | Wang ............ H01L 33/007 |
| 2016/0351756 A1* | 12/2016 | Noichi ............ H01L 33/38 |
| 2017/0145310 A1* | 5/2017 | Li ............ C09K 11/886 |
| 2017/0241611 A1* | 8/2017 | Pan ............ F21S 48/212 |
| 2017/0373118 A1* | 12/2017 | Hugon ............ H01L 27/156 |

FOREIGN PATENT DOCUMENTS

| | | |
|---|---|---|
| TW | 200405753 | 4/2004 |
| TW | 200514281 | 4/2005 |
| TW | 200610198 | 3/2006 |
| TW | I434437 | 4/2014 |
| TW | 201531586 | 8/2015 |

\* cited by examiner

LIGHT EMITTING DEVICE WITH BUFFER PADS

CROSS-REFERENCE TO RELATED APPLICATION

This application is a continuation-in-part application of and claims the priority benefit of U.S. application Ser. No. 15/001,250, filed on Jan. 20, 2016, now pending, which claims the priority benefit of Taiwan application serial no. 104129262, filed on Sep. 4, 2015. The entirety of each of the above-mentioned patent applications is hereby incorporated by reference herein and made a part of this specification.

BACKGROUND OF THE INVENTION

Field of the Invention

The invention relates to a semiconductor device, and particularly relates to a light emitting device.

Description of Related Art

In general, a light emitting chip is composed of an epitaxial structure, an N type electrode, and a P type electrode. In addition, the N type electrode and the P type electrode may respectively contact an N type semiconductor layer and a P type semiconductor layer. To make the light emitting chip more applicable, the light emitting chip that is manufactured may be heated for metal bonding to be fixed to a circuit board, so as to form a light emitting module. Due to a mismatch between thermal expansion coefficients of materials of the light emitting chip and the circuit board, a thermal stress and an internal stress that are generated become more and more significant. Thus, there may be dislocation between the epitaxial structure of the light emitting chip and the circuit board, and a structural reliability of the product consequently becomes less desirable.

SUMMARY OF THE INVENTION

The invention provides a light emitting device suitable to be disposed to various receiving substrates and having a preferable structural reliability.

A light emitting device according to an embodiment of the invention includes a carrier, a plurality of light emitting diode chips and a plurality of buffer pads. The light emitting diode chips are disposed on the carrier, wherein each light emitting diode chip includes a first type semiconductor layer, an active layer, a second type semiconductor layer, a via hole and a plurality of bonding pads. The active layer is disposed on the first type semiconductor layer. The second type semiconductor layer is disposed on the active layer. The via hole sequentially penetrates through the first type semiconductor layer, the active layer and a portion of the second type semiconductor layer. The first type semiconductor layer, the active layer, the second type semiconductor layer and the via hole define an epitaxial structure. The bonding pads are disposed between the epitaxial structure and a receiving substrate and includes a first bonding pad electrically connected to the first type semiconductor layer and a second bonding pad electrically connected to the second type semiconductor layer. The buffer pads are located on the carrier and disposed between the carrier and the second type semiconductor layer of the epitaxial structures, wherein the buffer pads are with Young's modulus of 2~10 GPa, the second bonding pad is disposed within the via hole to contact the second type semiconductor layer, and the epitaxial structures are electrically bonded to the receiving substrate through the bonding pads.

According to an embodiment of the invention, a material of the buffer pads is organic with Young's modulus of 2.9~3.6 GPa.

According to an embodiment of the invention, the material of the buffer pads is organic with break elongation 5~10% and residual stress 30~40 MPa.

According to an embodiment of the invention, the receiving substrate comprises a plurality of circuit electrodes, and the bonding pads are electrically connected to the circuit electrodes.

According to an embodiment of the invention, the each light emitting diode chip further includes an insulating layer. The insulating layer is disposed on the first type semiconductor layer and a sidewall of the via hole, wherein the insulating layer fauns a contact opening to expose the first type semiconductor layer and form another opening in the via hole to expose the second type semiconductor layer and the first bonding pad is disposed in the contact opening, the second bonding pad is disposed in another opening, and a portion of the insulating layer is located between a side wall of the via hole and the second bonding pad.

According to an embodiment of the invention, the receiving substrate comprises a plurality of sub-pixels, each of the epitaxial structures corresponds to one of the sub-pixels.

According to an embodiment of the invention, the receiving substrate comprises a plurality of light-obstructed structures, and the light-obstructed structures and the light emitting diode chips are arranged alternately.

According to an embodiment of the invention, a height of each light-obstructed structure is higher than a position of the active layer of the adjacent epitaxial structure.

According to an embodiment of the invention, the thickness of the second type semiconductor layer is 3 times to 15 times of a thickness of the active layer, and the thickness of the second type semiconductor layer is 10 times to 20 times of the thickness of the first type semiconductor layer.

According to an embodiment of the invention, an area of an orthogonal projection of each of the buffer pads on the carrier is 0.6 times to 1.2 times of an area of an orthogonal projection of the epitaxial structure on the carrier.

According to an embodiment of the invention, in a vertical direction with respect to the carrier, each of the buffer pads and the epitaxial structure are conformal patterns.

According to an embodiment of the invention, the receiving substrate comprises a thin film transistor substrate, a complementary metal oxide semiconductor substrate, a printed circuit board substrate or a flexible substrate.

According to an embodiment of the invention, an orthogonal projection area of the first bonding pad on the receiving substrate is the same as an orthogonal projection area of the second bonding pad on the receiving substrate.

According to an embodiment of the invention, an orthogonal projection area of the first bonding pad on the receiving substrate is different from an orthogonal projection area of the second bonding pad on the receiving substrate.

A light emitting device according to an embodiment of the invention includes a carrier, a plurality of light emitting diode chips and a plurality of buffer pads. The light emitting diode chips are disposed on the carrier, wherein each light emitting diode chip includes a first type semiconductor layer, an active layer, a second type semiconductor layer, a via hole and a plurality of bonding pads. The active layer is disposed on the first type semiconductor layer. The second type semiconductor layer is disposed on the active layer. The via hole sequentially penetrates through the first type semiconductor layer, the active layer and a portion of the second type semiconductor layer, wherein the first type semiconductor layer, the active layer, the second type semiconductor layer and the via hole define an epitaxial structure. The bonding pads are disposed between the epitaxial structure and a receiving substrate and includes a first bonding pad electrically connected to the first type semiconductor layer and a second bonding pad electrically connected to the second type semiconductor layer. The buffer pads are located on the carrier and disposed between the carrier and the second type semiconductor layers of the epitaxial structures, wherein the buffer pads are with Young's modulus of 2~10 GPa, the second bonding pad is disposed within the via hole to contact the second type semiconductor layer, the epitaxial structures are electrically bonded to the receiving substrate through the bonding pads, and a gap between any adjacent two of the buffer pads is 0.2 times to 2 times of a side length of each of the epitaxial structures.

According to an embodiment of the invention, a material of the buffer pads is organic with Young's modulus of 2.9~3.6 GPa.

According to an embodiment of the invention, the material of the buffer pads is organic with break elongation 5~10% and residual stress 30~40 MPa.

According to an embodiment of the invention, the receiving substrate comprises a plurality of light-obstructed structures and the light-obstructed structures and the light emitting diode chips are arranged alternately.

According to an embodiment of the invention, a height of each light-obstructed structure is higher than a position of the active layer of the adjacent epitaxial structure.

Based on above, since the light emitting device according to the embodiments of the invention has the buffer pad, the buffer pad may absorb the internal stress generated when the light emitting device is disposed on the receiving substrate and the bonding pad is thermally bonded to the receiving substrate, and the movement generated when a high stress is applied to the epitaxial structure is also reduced. In brief, the buffer pad may prevent the dislocation between the epitaxial structure and the receiving substrate. Thus, the structural design of the light emitting device according to the embodiments of the invention helps the subsequent thermal bonding process, and may effectively improve the structural reliability of the light emitting device.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
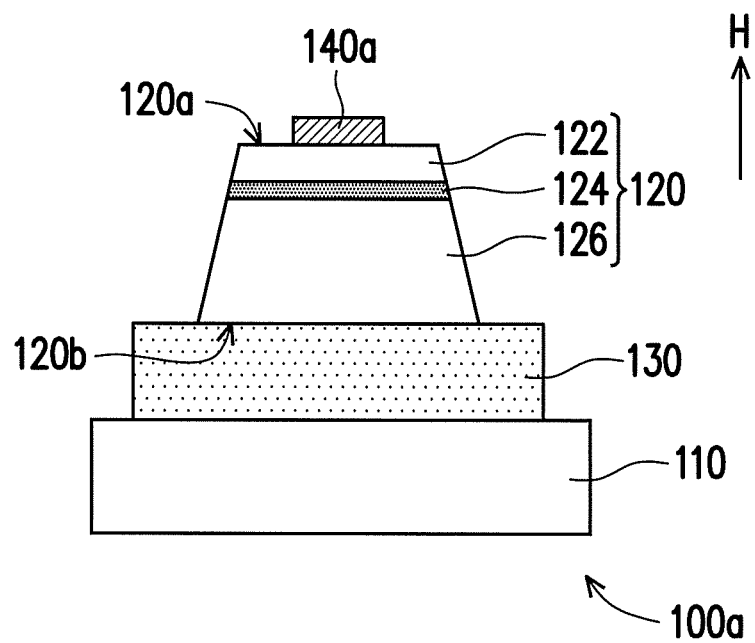
FIG. 1A is a schematic cross-sectional view illustrating a light emitting device according to an embodiment of the invention.

FIG. 1A is a schematic cross-sectional view illustrating a light emitting device according to an embodiment of the invention. Referring to FIG. 1A, in this embodiment, a light emitting device 100a includes a carrier 110, at least one epitaxial structure 120 (FIG. 1A only shows one epitaxial structure), at least one buffer pad 130 (FIG. 1A only shows one buffer pad 130), and at least one bonding pad 140a (FIG. 1A only shows one bonding pad 140a). The epitaxial structure 120 is disposed on the carrier 110. The buffer pad 130 is disposed between the carrier 110 and the epitaxial structure 120, wherein the epitaxial structure 120 is temporarily bonded to the carrier 110 by the buffer pad 130. The bonding pad 140a is disposed on the epitaxial structure 120, wherein the epitaxial structure 120 is electrically connected to a receiving substrate (not shown) through the bonding pad 140a.

Specifically, the carrier 110 of this embodiment is substantially a tentative substrate for temporarily carrying the epitaxial structure 120. In addition, a material of the carrier 110 may include Si, SiC, GaAs, GaN, glass, sapphire, or ceramics, for example. The epitaxial structure 120 includes a first type semiconductor layer 122, an active layer 124, and a second type semiconductor layer 126. In addition, the active layer 124 is located between the first type semiconductor layer 122 and the second type semiconductor layer 126, and the second type semiconductor layer 126 is located between the active layer 124 and the buffer pad 130. In the epitaxial structure 120 of this embodiment, the first type semiconductor layer 122 is a P type semiconductor layer, for example, the second type semiconductor layer 126 is an N type semiconductor layer, for example, and the active layer 124 is a multiple quantum well (MQW) structure. In other embodiments not shown herein, it is also viable that the first type semiconductor layer 122 is an N type semiconductor layer, for example, the second type semiconductor layer 126 is a P type semiconductor layer, for example, and the active layer 124 is a multiple quantum well structure. The invention does not intend to impose a limitation in this regard.

More specifically, the epitaxial structure 120 may include a Group II-VI material (e.g., ZnSe) or a Group III-V nitride material (e.g., GaN, AlN, InN, InGaN, AlGaN, or AlInGaN). In addition, a side length of the epitaxial structure 120 of the embodiment is smaller than the side length of the conventional light emitting diode (e.g., the side length in a range from 0.2 millimeters to 1 millimeter). Preferably, the side length of the epitaxial structure 120 is in a range from 3 micrometers to 40 micrometers. In this embodiment, a bottom surface 120b of the epitaxial structure 120 is wider than a top surface 120a of the epitaxial structure 120, and a cross-sectional side of the epitaxial structure may be deemed as a trapezoid. More specifically, a side length of the first type semiconductor layer 122 is smaller than a side length of the second type semiconductor layer 126, and a difference in side lengths between the first type semiconductor layer 122 and the second type semiconductor layer 126 is in a range from 0.5 micrometers to 5 micrometers. Preferably, the side length of the first type semiconductor layer 122 is in a range from 3 micrometers to 38 micrometers, and the side length of the second type semiconductor layer 126 is in a range from 3.5 micrometers to 40 micrometers. In other embodiments not shown herein, the top surface 120a of the epitaxial structure 120 may also be wider than the bottom surface 120b of the epitaxial structure 120. The cross-sectional side of the epitaxial structure 120 may be deemed as an inverted trapezoid. Namely, the side length of the first type semiconductor layer 122 is greater than the side length of the second type semiconductor layer 126, and the difference in side lengths between the first type semiconductor layer 122 and the second type semiconductor layer 126 is in a range from 0.5 micrometers to 5 micrometers. Preferably, the side length of the first type semiconductor layer 122 is in a range from 3.5 micrometers to 40 micrometers, and the side length of the second type semiconductor layer 126 is in a range from 3 micrometers to 38 micrometers. Furthermore, in yet other embodiments not shown herein, the bottom surface 120b of the epitaxial structure 120 and the top surface 120a of the epitaxial structure 120 may have similar side lengths, and the cross-sectional side of the epitaxial structure 120 may be deemed as a rectangle. Namely, the side length of the first type semiconductor layer 122 and the side length of the second type semiconductor layer 126 are equal. Preferably, the side lengths of the first type semiconductor layer 122 and the second type semiconductor layer 126 are respectively in a range from 3 micrometers to 40 micrometers. Among the three types of embodiments, the design that the bottom surface 120b of the epitaxial structure 120 is wider than the top surface 120a of the epitaxial structure 120 (i.e., the side length of the first type semiconductor layer 122 is smaller than the side length of the second type semiconductor layer 126 and the cross-sectional side of the epitaxial structure 120 is deemed as a trapezoid) is advantageous in having a greater contact area between the epitaxial structure 120 and the buffer pad 130, thus having a desirable stress releasing effect.

As shown in FIG. 1A, in the epitaxial structure 120 of this embodiment, the second type semiconductor layer 126 is close to the buffer pad 130, and the second type semiconductor layer 126 directly contacts the buffer pad 130. Moreover, a thickness of the second type semiconductor layer 126 of this embodiment is greater than a thickness of the first type semiconductor layer 122. In addition, the thickness of the second type semiconductor layer 126 is in a range from 1 micrometer to 6 micrometers, a thickness of the active layer 124 is in a range from 0.1 micrometers to 1 micrometer, and the thickness of the first type semiconductor layer 122 is in a range from 0.1 micrometers to 0.5 micrometers. In an exemplary embodiment, the thickness of the second type semiconductor layer 126 is 5 micrometers, for example, the thickness of the active layer 124 is 0.7 micrometers, for example, and the thickness of the first type semiconductor layer. 122 is 0.4 micrometers, for example. Moreover, the second type semiconductor layer 126 in the epitaxial structure 120 has the greatest thickness. The thickness of the second type semiconductor layer 126 is 3 times to 15 times of the thickness of the active layer 124, and the thickness of the second type semiconductor layer 126 is 10 times to 20 times of the thickness of the first type semiconductor layer 122. By having the thickest second type semiconductor layer 126 directly contacting the buffer pad 130, the active layer 124 may be protected to prevent the structure of the active layer 124 from being damaged to thus influence light emitting of the light emitting device 100a.

Moreover, a highest peak current density of an external quantum efficiency curve of the epitaxial structure 120 of this embodiment is smaller than the peak current density of the epitaxial structure of the conventional light emitting diode. Preferably, the highest peak current density of the external quantum efficiency curve of the epitaxial structure 120 of this embodiment is lower than 2 A/cm$^2$. More preferably, the highest peak current density of the external quantum efficiency curve of the epitaxial structure 120 of this embodiment is in a range from 0.5 A/cm$^2$ to 1.5 A/cm$^2$. Namely, the epitaxial structure 120 of this embodiment is suitable to be operated at a low current density. In addition, compared to the epitaxial structure of the conventional light emitting diode, a defect density of the epitaxial structure 120 of this embodiment is also smaller. In general, the defect density of the epitaxial structure of the conventional light emitting diode is approximately in a range from $10^9$/cm$^2$ to $10^{10}$/cm$^2$, while the defect density of the epitaxial structure 120 of this embodiment is smaller than $5\times10^8$/cm$^2$, and preferably in a range from $5\times10^5$/cm$^2$ to $10^8$/cm$^2$. Moreover, the buffer pad 130 of this embodiment may serve as a buffer structure. A material of the buffer pad 130 of this embodiment is an organic, for example, an adhesive polymer, such as epoxy resin, polyimide, polyester, polyurethane, benzocyclobutene, polyethylene, polypropylene, polyacrylate, and a combination thereof, and the buffer pad 130 may be formed through thermal curing or UV curing. In other words, the buffer pad 130 may simultaneously offer adhesive and buffering functions. In an exemplary embodiment, the buffer pad 130 is formed of a polymer through UV curing. In an exemplary embodiment, a material of the buffer pad 130 is with Young's Modules of 2.9~3.6 GPa, break elongation of 5~10%, or residual stress of 30~40 MPa.

Figure 1B:
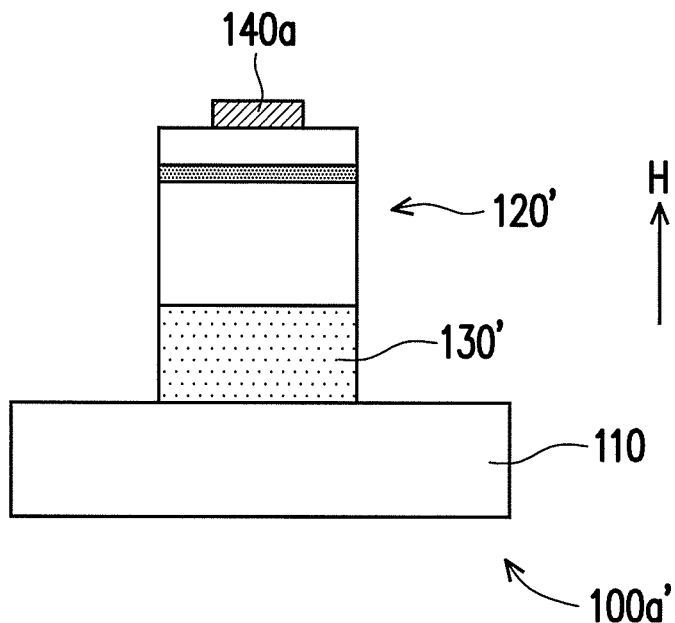
FIG. 1B is a schematic cross-sectional view illustrating a light emitting device according to another embodiment of the invention.

As shown in FIG. 1A, a position of the buffer pad 130 and a position of the epitaxial structure 120 in this embodiment correspond to each other. In addition, an area of an orthogonal projection of the buffer pad 130 on the carrier 110 is 0.6 times to 1.2 times of an area of an orthogonal projection of the epitaxial structure 120 on the carrier 110. The buffer pad 130 is structurally designed to ensure that a stress applied to any position of the epitaxial structure 120 may be absorbed by the buffer pad 130. The buffer pad 130 may be a single-layer or multi-layer structure. For example, the buffer pad 130 may be a dual-layer structure formed of two polymer materials or a multi-layer structure formed by alternately stacking two polymer materials. However, the invention is not limited thereto. Besides, as shown in FIGS. 1A and 1B, the epitaxial structures 120 and 120' may serve as a mask and an etching process may be performed to define shapes and sizes of the buffer pads 130 and 130'. In other words, viewing from a vertical direction H with respect to the carrier 110, the buffer pads 130 and 130' and the epitaxial structures 120 and 120' of the light emitting devices 100a and 100a' of the embodiments are shown as substantially similar patterns. As shown in FIG. 1A, the cross-sectional side of the epitaxial structure 120 that serves as a mask is deemed as a trapezoid. Therefore, the size of the buffer pad 130 defined after the etching process is slightly greater than that of the epitaxial structure 120. As shown in FIG. 1B, the cross-sectional side of the epitaxial structure 120' serving as a mask is deemed as a rectangle. Therefore, the buffer pad 130' defined after the etching process is similar to the epitaxial structure 120'. In other embodiments not shown herein, when the cross-sectional side of the epitaxial structure 120 is deemed as an inverted trapezoid, the size of the buffer pad 130 defined after the etching process is slightly smaller than the epitaxial structure 120. More specifically, a relation between the size of the buffer pad 130 and the size of the epitaxial structure 120 may be controlled by adjusting parameters of the etching process.

Besides, the bonding pad 140a of this embodiment is located on the first type semiconductor layer 122 and is structurally and electrically connected to the first type semiconductor layer 122. The epitaxial structure 120 of this embodiment may be electrically connected to the receiving substrate (not shown) through the bonding pad 140a, so as to improve an applicability of the light emitting device 100a. The bonding pad 140a may include one or multiple layers. For example, the bonding pad 140a may include an electrode layer (not shown) and an optionally disposed barrier layer (not shown). The electrode layer may form an ohmic contact with the first type semiconductor layer 122, and a material of the electrode layer may include a high work function metal (e.g., platinum, nickel, titanium, gold, chromium, and a combination thereof) or metal oxide (e.g., indium tin oxide and zinc oxide). The barrier layer may be optionally disposed to prevent impurities from diffusing into the first type semiconductor layer 122. For example, a material of the barrier layer includes, but is not limited to titanium-tungsten alloy, platinum, palladium, titanium, tantalum, and a combination thereof. The bonding pad 140a may further include a reflective layer (not shown) to reflect light emitted by the active layer 124. For example, the reflective layer includes, but is not limited to, silver, aluminum, and an alloy thereof. Furthermore, the bonding pad 140a may also include a non-metal conductive material, such as conductive polymer, graphite, graphene, and black phosphorus. In this embodiment, the bonding pad 140a may be formed of a metal material, a non-metal material, or a combination of metal and non-metal materials, as long as the bonding pad 140a makes the epitaxial structure 120 and the receiving substrate (not shown) electrically connect to each other. When being electrically connected to the receiving substrate, the bonding pad 140a of the light emitting device 100a is aligned and pressed to a pad (not shown) of the receiving substrate through hot pressing. Under a high temperature, a high stress is applied for a period of time for bonding. At this time, the buffer pad 130 of the light emitting device 100a may serve as a buffer to absorb an internal stress generated during bonding, so as to reduce a movement generated when the high stress is applied to the epitaxial structure 120, thereby preventing dislocation between the epitaxial structure 120 and the receiving substrate.

It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 2:
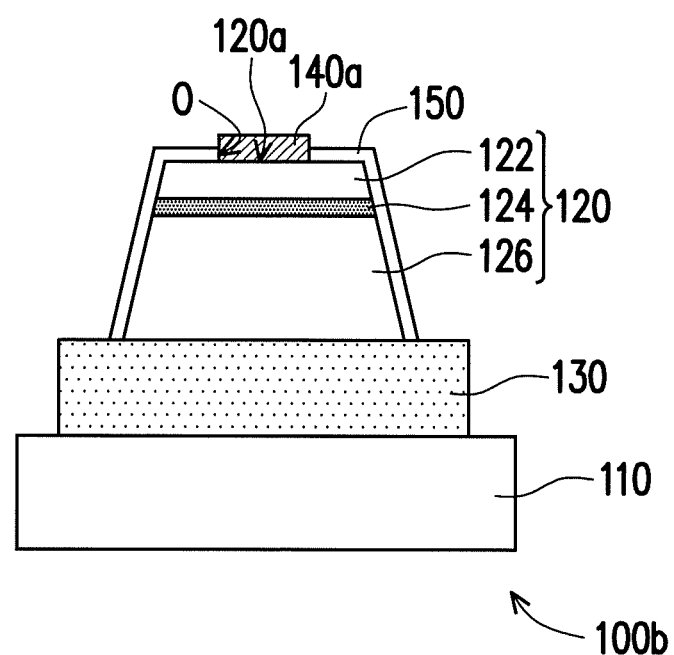
FIG. 2 is a schematic cross-sectional view illustrating a light emitting device according to another embodiment of the invention.

FIG. 2 is a schematic cross-sectional view illustrating a light emitting device according to another embodiment of the invention. Referring to FIGS. 1A and 2 together, a light emitting device 100b of this embodiment is similar to the light emitting device 100a shown in FIG. 1A, except for a difference that the light emitting device 100b of this embodiment further includes an insulating layer 150. The insulating layer 150 is disposed on the buffer pad 130 and covers a sidewall of the epitaxial structure 120, and the insulating layer 150 exposes the top surface 120a of the epitaxial structure 120 to form a contact opening O. A width of the contact opening O is smaller than a width of the top surface 120a of the epitaxial structure 120, and the bonding pad 140a is disposed on the contact opening O and electrically connected to the epitaxial structure 120. In other embodiments not shown herein, the width of the contact opening O may be greater than, close to, or approximately equal to the width of the top surface 120a of the epitaxial structure 120, and the invention is not limited thereto. The insulating layer 150 is disposed to protect an edge of the epitaxial structure 120, so as to prevent the epitaxial structure 120 from moisture and oxygen, and may effectively improve a product reliability of the light emitting device 100b. A material of the insulating layer 150 includes silicon dioxide, aluminum oxide, silicon nitride, and a combination thereof, for example.

Figure 3:
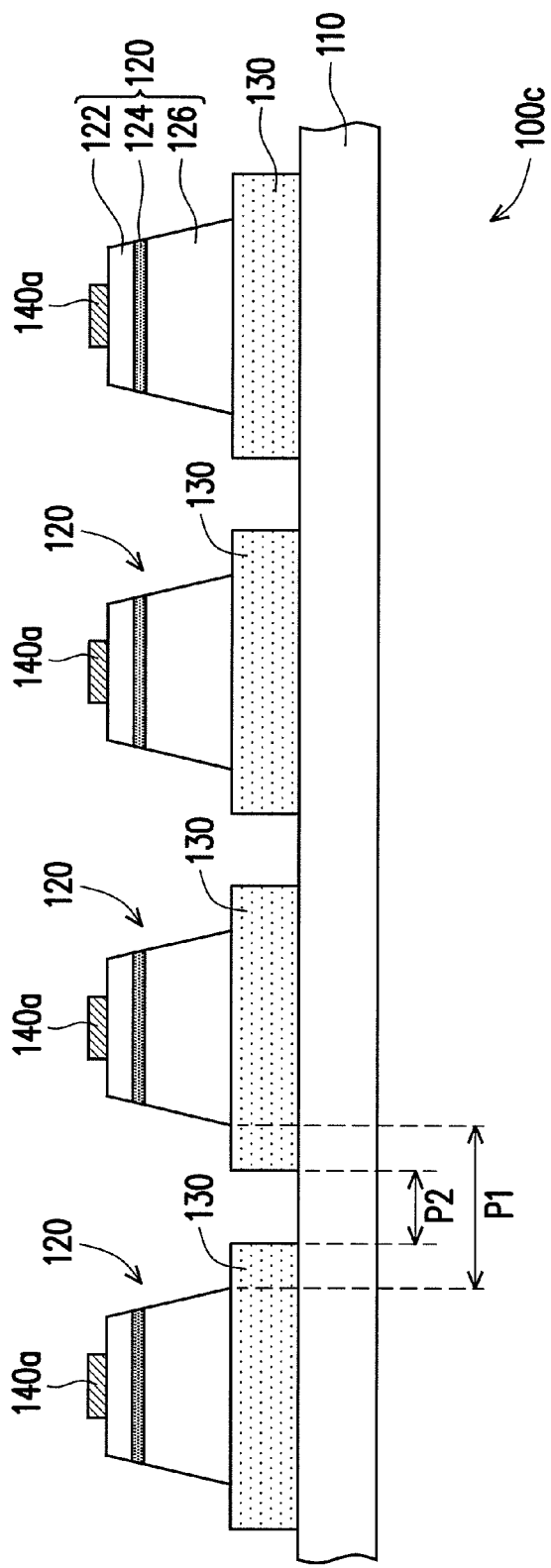
FIG. 3 is a schematic cross-sectional view illustrating a light emitting device according to another embodiment of the invention.
Figure 4:
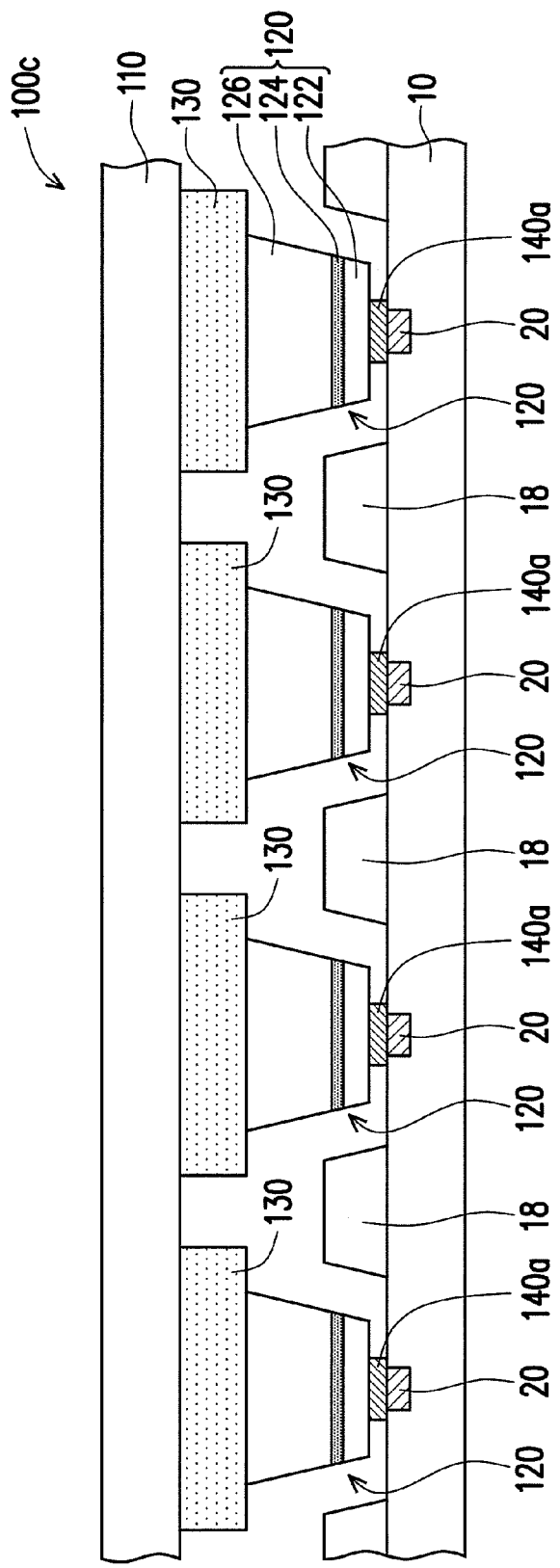
FIG. 4 is a schematic cross-sectional view illustrating the light emitting device of FIG. 3 being thermally bonded to a receiving substrate.

FIG. 3 is a schematic cross-sectional view illustrating a light emitting device according to another embodiment of the invention. Referring to FIGS. 1A and 3 together, a light emitting device 100c of this embodiment is similar to the light emitting device 100a shown in FIG. 1A, except for a main difference that the light emitting device 100c of this embodiment includes a plurality of the epitaxial structures 120 and a plurality of the buffer pads 130. In addition, the epitaxial structures 120 are periodically and separately disposed on the carrier 110, and the buffer pads 130 are respectively disposed in correspondence with the epitaxial structures 120. In an embodiment, the epitaxial structure 120 is in an array arrangement, and a pitch P1 between any adjacent two epitaxial structures 120 is in a range from 2 micrometers to 70 micrometers, and a pitch P2 between any adjacent two buffer pads 130 is in a range from 2 micrometers to 70 micrometers. Regarding subsequent processes, referring to FIG. 4, when the light emitting device 100c is electrically connected to a receiving substrate 10 through a thermal bonding process, the bonding pad 140a may be electrically connected to a pad 20 on the receiving substrate 10. At this time, the buffer pad 130 may absorb the internal stress generated during bonding and reduce the movement generated when the high stress is applied to the epitaxial structure 120. In this embodiment, the receiving substrate 10 may be a display substrate, a lighting substrate, a substrate having transistors or integrated circuits (ICs), or a substrate having metal redistribution lines. More specifically, the pad 20 is formed of a material having a melting temperature lower than 140° C., such as tin or indium. During a thermal bonding process with such design, the receiving substrate 10 is heated to a temperature higher than the melting temperature of the pad 20 and lower than a melting temperature of the bonding pad 140a. At such temperature, the pad 20 is turned into a liquid state, while the bonding pad 140a remains in a solid state, and when the pad 20 and the bonding pad 140a are connected, the liquid-state pad 20 may reduce a collision force at a contact surface, so as to prevent the light emitting device 100c from tilting and assuage imbalance among forces applied to the respective epitaxial structures 120 when bonding.

In this embodiment, the pad 20 is aligned to (co-planer to) the receiving substrate 10. However, the invention is not limited thereto. In other embodiments not shown herein, the pad 20 may also be a block protruding from the receiving substrate 10. Namely, an upper surface of the pad 20 is higher than an upper surface of the receiving substrate 10. Alternatively, the pad 20 may also be a block recessed into the receiving substrate 10. Namely, the upper surface of the pad 20 is lower than the upper surface of the substrate 10. Besides, the upper surface of the receiving substrate 10 between the pads 20 may form a light absorption layer 18 to absorb a portion of scattered light, so as to reduce a mutual light interference between the epitaxial structures 120.

In this embodiment, the pitch P2 between any adjacent two buffer pads 130 is 0.2 times to 2 times of the side length of the epitaxial structure 120. Preferably, the pitch P2 between any adjacent two buffer pads 130 is smaller than the side length of the epitaxial structure 120, and the pitch P2 between any adjacent two buffer pads 130 is 0.2 times to 0.9 times of the side length of the epitaxial structure 120. If the pitch P2 is smaller than 0.2 times of the side length of the epitaxial structure 120, the buffer pad 130 may expand due to a stress and contact the adjacent buffer pad 130 during the thermal bonding process, thus resulting in a movement of the corresponding epitaxial structure 120. If the pitch P2 is greater than 2 times of the side length of the epitaxial structure 120, a buffer area in the thermal bonding process is not enough, and the epitaxial structure 120 may be damaged easily. In brief, the buffer pad 130 may prevent the dislocation between the epitaxial structure 120 and the receiving substrate 10 and protect the epitaxial structure 120 as well. Thus, the structural design of the light emitting device 100c of this embodiment helps the subsequent thermal bonding process, and may effectively improve a structural reliability of the light emitting device 100c. In addition, since the thickness of the second type semiconductor layer 126 is greater than the thickness of the first type semiconductor layer 122, i.e., the thickness of the first type semiconductor layer 122 is smaller than the thickness of the second type semiconductor layer 126, when the light emitting device 100c is bonded to the receiving substrate 10, the active layer 124 of the epitaxial structure 120 may be closer to the substrate 10, thus resulting in a preferable heat dissipation effect. It should be noted that, after the thermal bonding process, the buffer pad 130 and the carrier 110 may be removed, and another bonding pad (not shown) may be manufactured on the second type semiconductor layer 126 of the epitaxial structure 120. At this time, the epitaxial structure 120, the bonding pad 140a, and the another bonding pad may define a vertically oriented light emitting diode chip.

Figure 5:
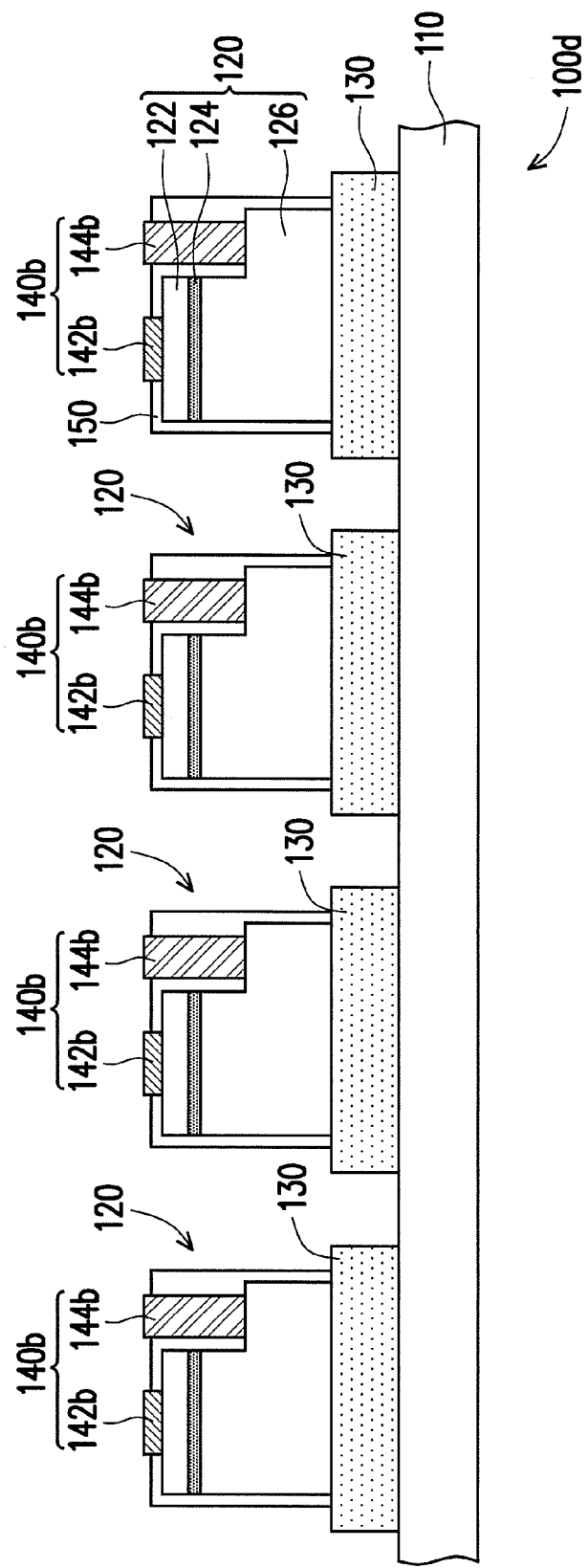
FIG. 5 is a schematic cross-sectional view illustrating a light emitting device according to another embodiment of the invention.

Besides, the invention does not limit the position and the number of the bonding pad 140a. Here, the bonding pad 140a is only disposed on a surface of the epitaxial structure 120 away from the buffer pad 130 and each epitaxial structure 120 is only provided with one bonding pad 140a, However, in other embodiments, referring to FIGS. 3 and 5 together, a light emitting device 100d of this embodiment is similar to the light emitting device 100c shown in FIG. 3, except for a main difference that a bonding pad 140b of the light emitting device 100d of this embodiment includes a first bonding pad 142b and a second bonding pad 144b. The first bonding pad 142b and the second bonding pad 144b are located at the same side of the epitaxial structure 120. In addition, the first bonding pad 142b is electrically connected to the first type semiconductor layer 122, and the second bonding pad 144b is electrically connected to the second type semiconductor layer 126. In other words, each epitaxial structure 120 in this embodiment is provided with a first bonding pad 142b and a second bonding pad 144b, and the first bonding pad 142b and the second bonding pad 144b are located on a surface of the epitaxial structure 120 away from the buffer pad 130. At this time, the design of the epitaxial structure 120, the first bonding pad 142b, and the second bonding pad 144b may be considered as a horizontally oriented light emitting diode chip.

Figure 6:
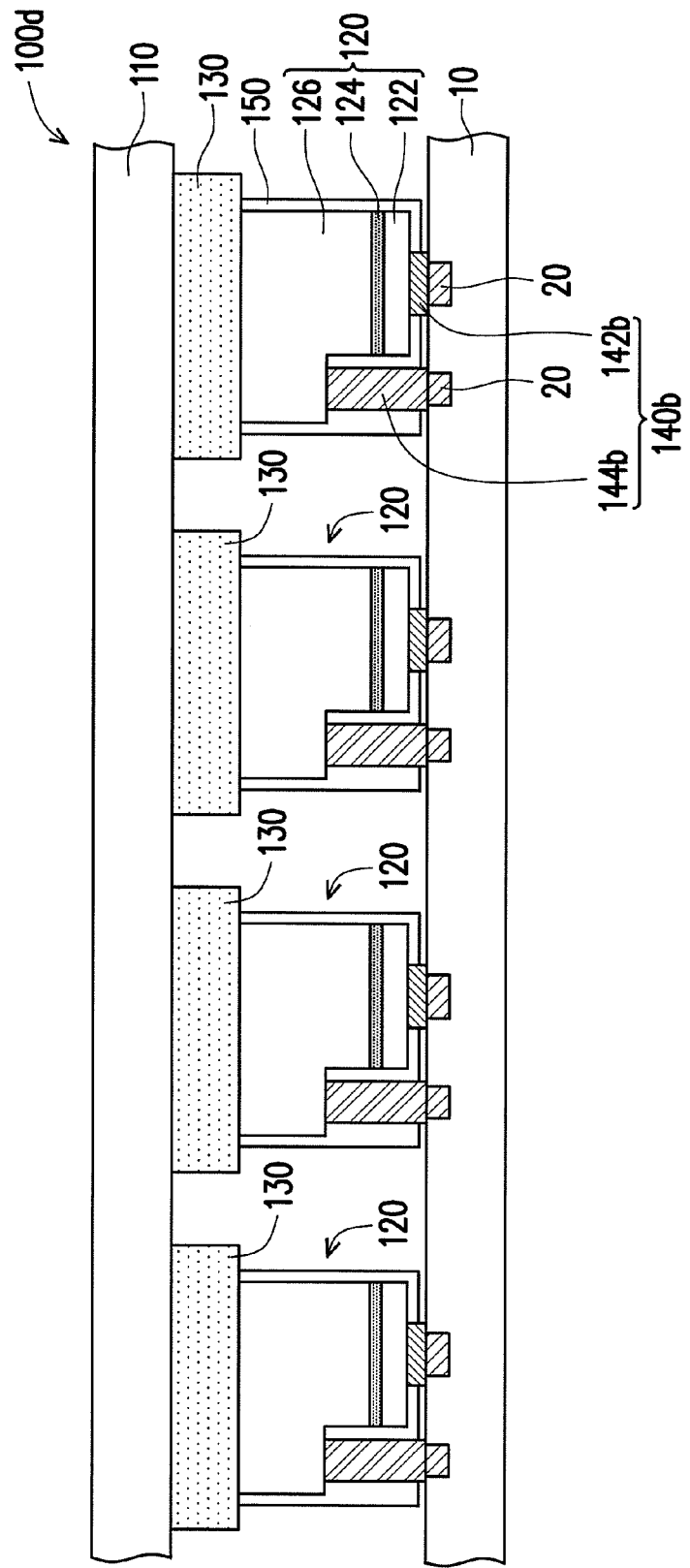
FIG. 6 is a schematic cross-sectional view illustrating the light emitting device of FIG. 5 being thermally bonded to a receiving substrate.

Besides, the light emitting device 100d may further include the insulating layer 150. The insulating layer 150 is disposed on the buffer pad 130 and covers the epitaxial structure 120, and the insulating layer 150 exposes the first bonding pad 142b and the second bonding pad 144b. The insulating layer 150 is disposed to protect the edge of the epitaxial structure 120, so as to prevent the epitaxial structure 120 from moisture and oxygen, and may effectively improve a product reliability of the light emitting device 100d. The material of the insulating layer 150 includes silicon dioxide, aluminum oxide, silicon nitride, and a combination thereof, for example. In the subsequent process, referring to. FIG. 6, when the light emitting device 100d is electrically connected to the receiving substrate 10 through the thermal bonding process, the first bonding pad 142b and the second bonding pad 144b may be electrically connected to the pad 20 on the receiving substrate 10. For example, the receiving substrate may be a display substrate, a lighting substrate, a substrate having transistors or integrated circuits, or a substrate having metal redistribution lines. At this time, the buffer pad 130 may absorb the internal stress generated during bonding and reduce the movement generated when the high stress is applied to the epitaxial structure 120. In brief, the buffer pad 130 may prevent the dislocation between the epitaxial structure 120 and the receiving substrate 10. Thus, the structural design of the light emitting device 100d of this embodiment helps the subsequent thermal bonding process, and may effectively improve a structural reliability of the light emitting device 100d.

Figure 7A:
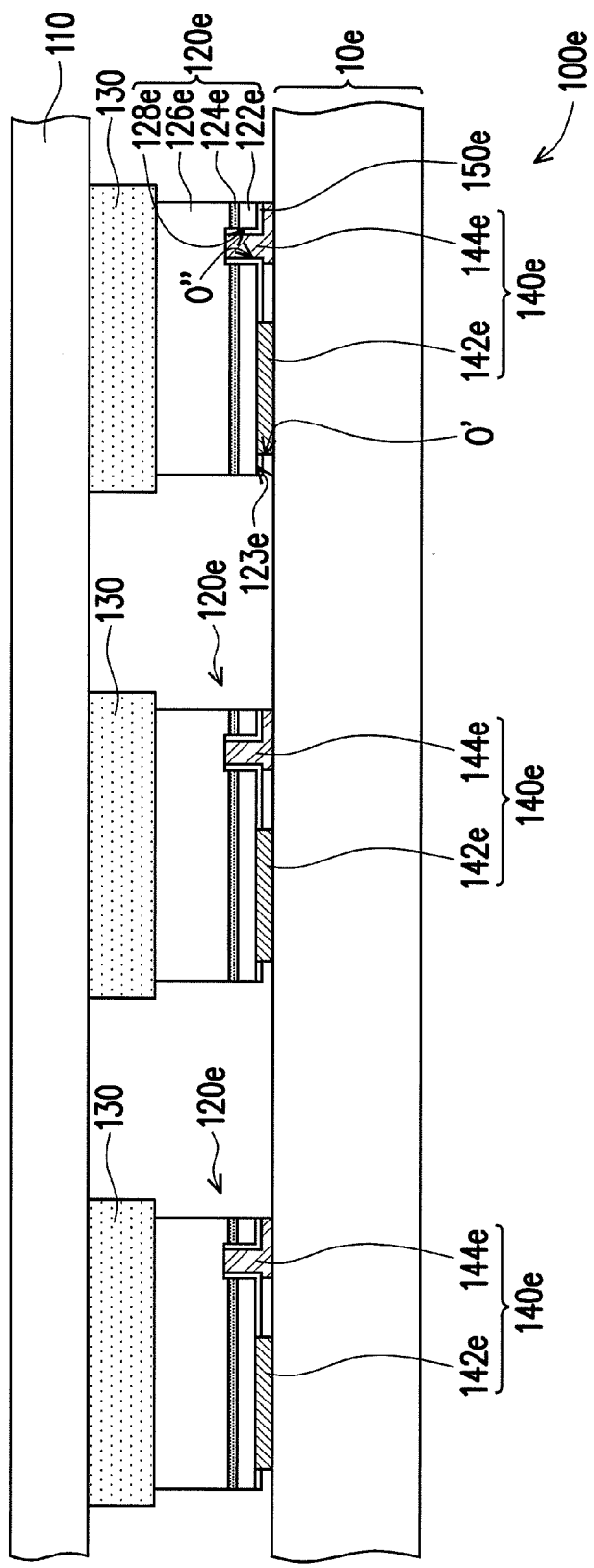
FIG. 7A is a schematic cross-sectional view illustrating a light emitting device according to another embodiment of the invention.

FIG. 7A is a schematic cross-sectional view illustrating a light emitting device according to another embodiment of the invention. Referring to FIG. 7A, in this embodiment, a light emitting device 100e includes the carrier 110, a plurality of epitaxial structures 120e, the buffer pads 130, and a plurality of bonding pads 140e. The epitaxial structures 120e are periodically and separately disposed on the carrier 110, and the buffer pads 130 are respectively disposed in correspondence with the epitaxial structures 120e. Each of the epitaxial structures 120e includes a first type semiconductor layer 122e, an active layer 124e, a second type semiconductor layer 126e and a via hole 128e. The active layer 124e is disposed on the first type semiconductor layer 122e. The second type semiconductor layer 126e is disposed on the active layer 124e. The via hole 128e sequentially penetrates through the first type semiconductor layer 122e, the active layer 124e and a portion of the second type semiconductor layer 126e.

Further, the buffer pads 130 of this embodiment are disposed between the carrier 110 and the second type semiconductor layers 126e of the epitaxial structures 120e, wherein the epitaxial structures 120e are connected to the carrier 110 by the buffer pads 130, respectively. The bonding pads 140e are disposed on the epitaxial structures 120e and includes at least one first bonding pad 142e (FIG. 7A shows a plurality of first bonding pad) and at least one second bonding pad 144e (FIG. 7A shows a plurality of second bonding pad). Each epitaxial structure 120e in this embodiment is provided with one first bonding pad 142e and one second bonding pad 144e, and the first bonding pad 142e and the second bonding pad 144e are located at the same side of the epitaxial structure 120e and on a surface 123e of the first type semiconductor layer 122e away from the corresponding buffer pad 130. Specifically, the first bonding pad 142e is electrically connected to the first type semiconductor layer 122e. The second bonding pad 144e is disposed within the via hole 128e from the surface 123e of the first type semiconductor layer 122e relatively far away from the carrier 110 so as to electrically connect to the second type semiconductor layer 126e. The epitaxial structure 120e is electrically connected to a receiving substrate 10e through the bonding pads 140e. Herein, the receiving substrate 10e, for example, is a thin film transistor substrate, a complementary metal oxide semiconductor substrate, a printed circuit board substrate or a flexible substrate, and the invention is not limited thereto.

Besides, as shown in FIG. 7A, the light emitting device 100e further includes at least one insulating layer 150e (FIG. 7A shows a plurality of insulating layer). In each of the epitaxial structures 120e, the insulating layer 150e is disposed on the first type semiconductor layer 122e and a sidewall of the via hole 128e, wherein the insulating layer 150e includes a contact opening O' to expose the surface 123e of the first type semiconductor layer 122e and another opening O" in the via hole 128e to expose the second type semiconductor layer 126e. The first bonding pad 142e is disposed on the insulating layer 150e and electrically contacts the first type semiconductor layer 122e through the contact opening O'. The second bonding pad 144e is also dispose on the insulating layer 150e and electrically contacts the second type semiconductor layer 126e through the opening O". In other words, the insulating layer 150e is located between the side wall of the via hole 128e and the second bonding pad 144e, and is disposed to electrically isolate the second bonding pad 144e from the first type semiconductor layer 122e and the active layer 124e.

Figure 7B:
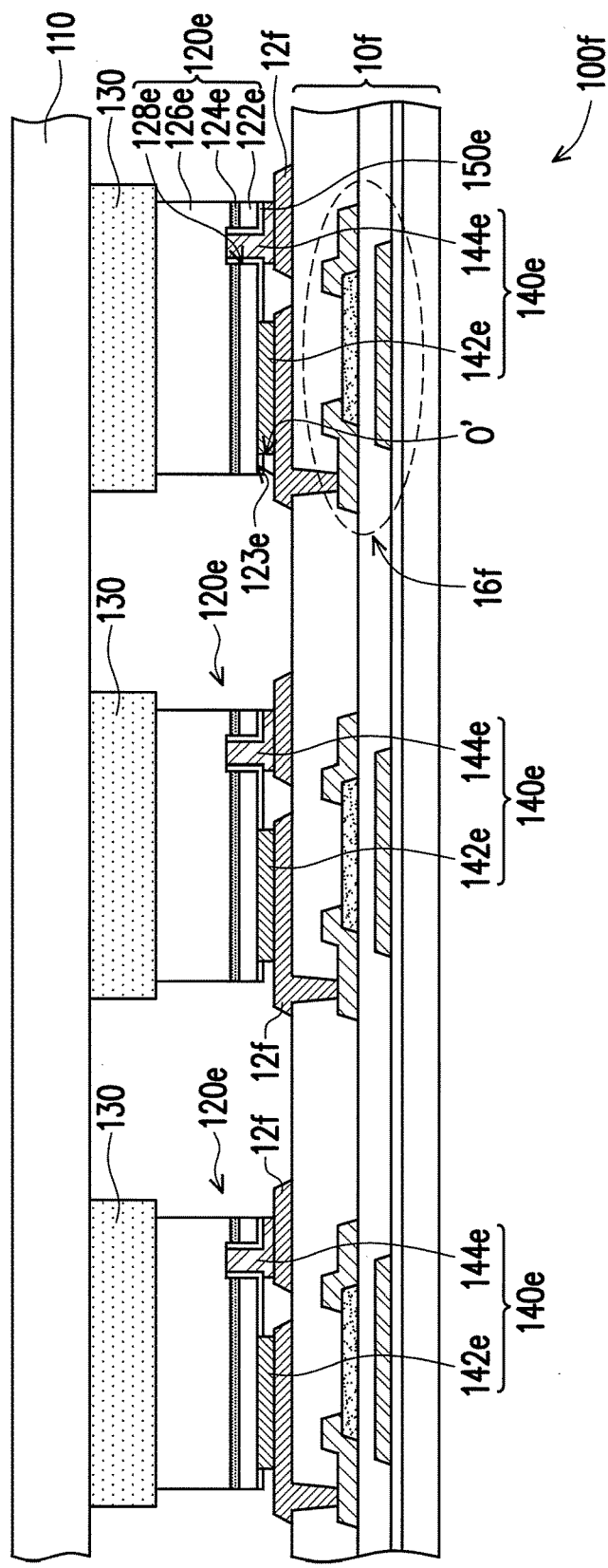
FIG. 7B is a schematic cross-sectional view illustrating a light emitting device according to another embodiment of the invention.

FIG. 7B is a schematic cross-sectional view illustrating a light emitting device according to another embodiment of the invention. Referring to FIGS. 7A and 7B together, a light emitting device 100f of this embodiment is similar to the light emitting device 100e shown in FIG. 7A, except for a main difference that the receiving substrate 10f includes a plurality of circuit electrodes 12f, and the first bonding pads 142e and the second bonding pads 144e are electrically connected to the circuit electrodes 12f. Herein, the receiving substrate 10f is embodied as a TFT substrate, and the circuit electrode 12f are electrically connected to the TFT structures 16f.

Since the light emitting devices 100e, 100f have the buffer pads 130, the buffer pads 130 may absorb the stress generated by thermal bonding process. Furthermore, the bonding shift between the light emitting devices 120e and the bonding pads 140e will be reduced with the lower stress. In brief, the buffer pads 130 may prevent the dislocation between the epitaxial structures 120e and the receiving substrates 10e, 10f.

Figure 8A:
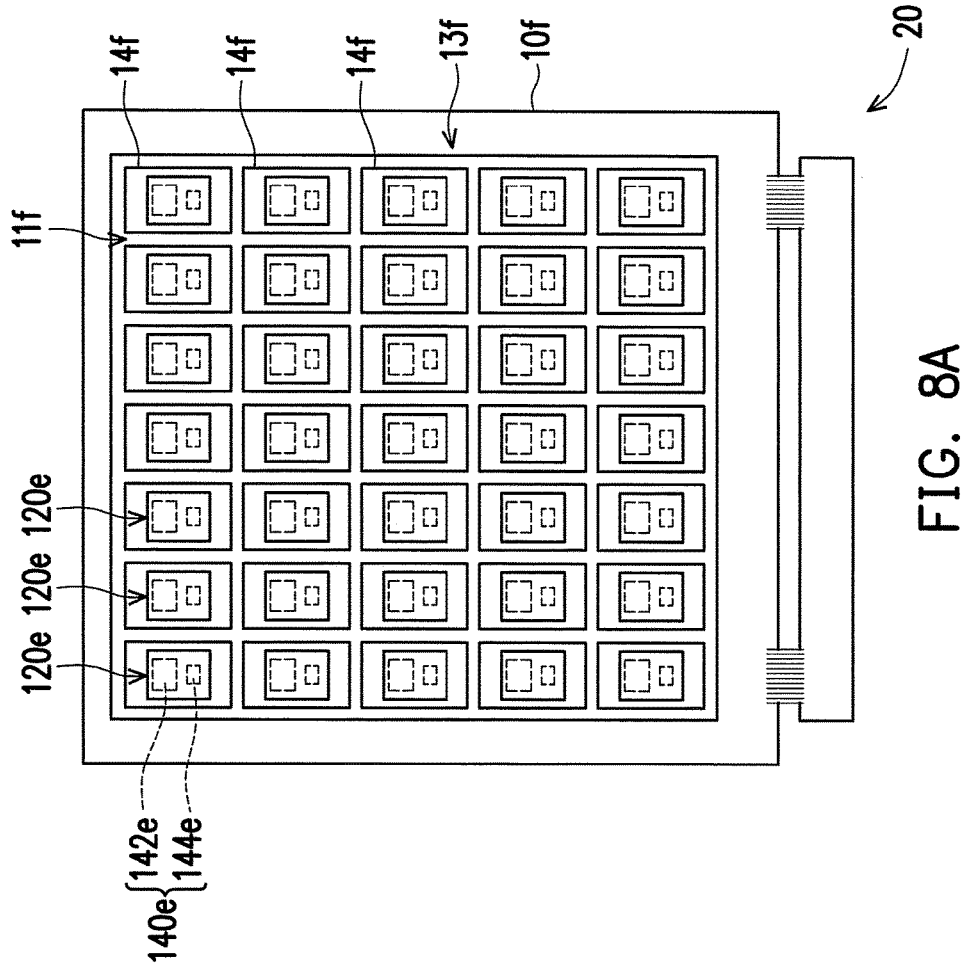
FIG. 8A is a schematic top view illustrating a display panel according to an embodiment of invention.
Figure 8B:
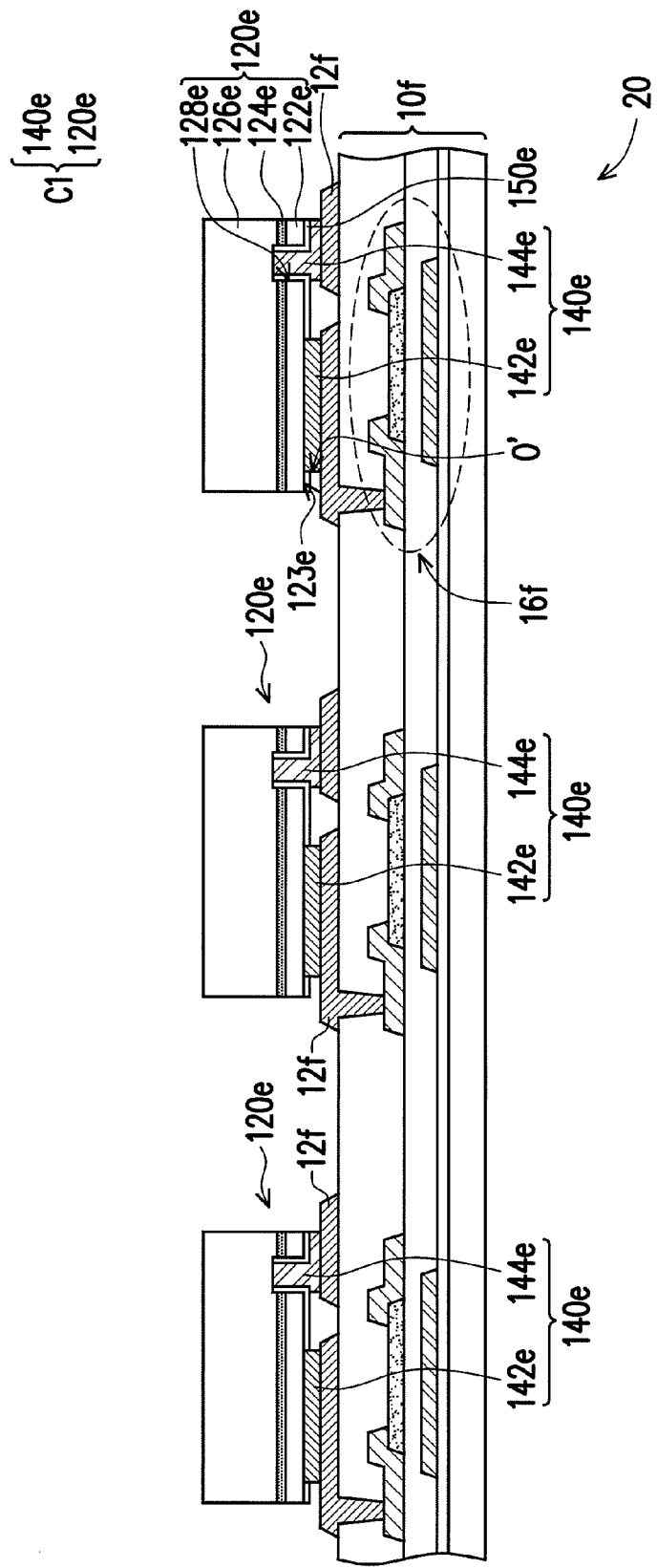
FIG. 8B is a schematic partial cross-sectional view of the display panel depicted in FIG. 8A.

After the bonding pads 140e are thermally bonded to the receiving substrate 10f, the buffer pads 130 and the carrier 110 will be removed to form a display panel 20. FIG. 8A is a schematic top view illustrating a display panel according to an embodiment of invention. FIG. 8B is a schematic partial cross-sectional view of the display panel depicted in FIG. 8A. Referring to FIGS. 8A and 8B, the receiving substrate 10f has a display region 11f and a peripheral region 13f outside the display region 11f. Further, the receiving substrate 10f includes a plurality of sub-pixels 14f in the display region 11f, and each of the epitaxial structures 120e corresponds to one of the sub-pixels 14f. The epitaxial structures 120e and the bonding pads 140e define a plurality of horizontally oriented light emitting diode chips C1, and the light emitting diode chips C1 are periodically and separately disposed on the receiving substrate 10f. Because of the need for precise alignment and mass transfer, the presence and location of the buffer pads 130 are more important to improve transfer yield of the light emitting diode chips C1 in transferring and bonding process.

Figure 9:
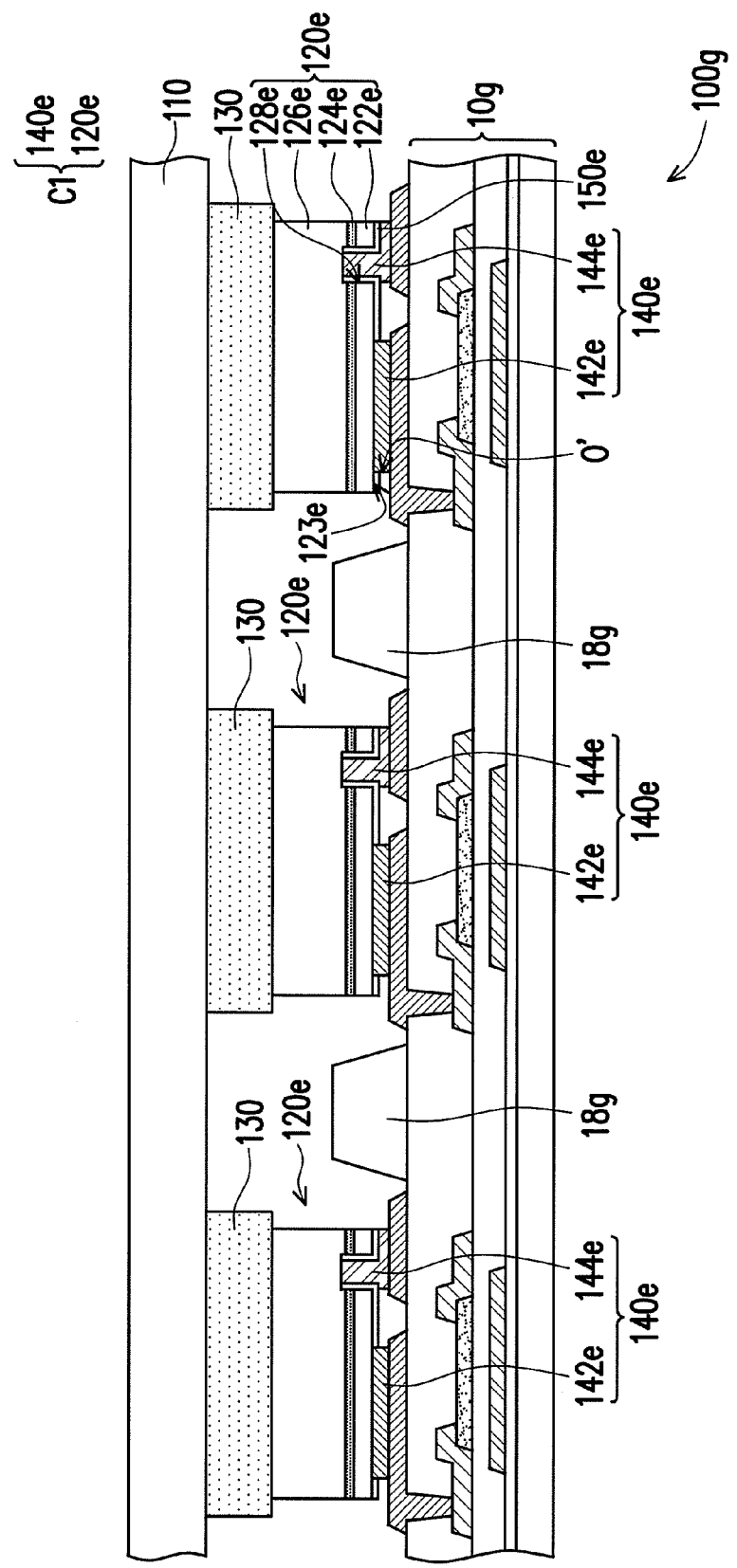
FIG. 9 is a schematic cross-sectional view illustrating a light emitting device according to another embodiment of the invention.

FIG. 9 is a schematic cross-sectional view illustrating a light emitting device according to another embodiment of the invention. Referring to FIGS. 7B and 9 together, a light emitting device 100g of this embodiment is similar to the light emitting device 100f shown in FIG. 7B, except for a main difference that the receiving substrate 10g comprises a plurality of light-obstructed structures 18g, the epitaxial structures 120e and the bonding pads 140e define a plurality of light emitting diode chips C1, and the light-obstructed structures 18g and the light emitting diode chips C1 are arranged alternately. In this embodiment, the light-obstructed structures 18g are disposed to absorb a portion of scattered light, so as to reduce a light mixing effect between the light emitting diode chips C1 of different color. Preferably, a height of each of the light-obstructed structures 18g is higher than a position of the active layers 124e of the epitaxial structures 120e. In other words, the height of one light-obstructed structure 18g is larger than a distance between the active layer 124e of adjacent epitaxial structure 120e and the receiving substrate 10g.

Figure 10:
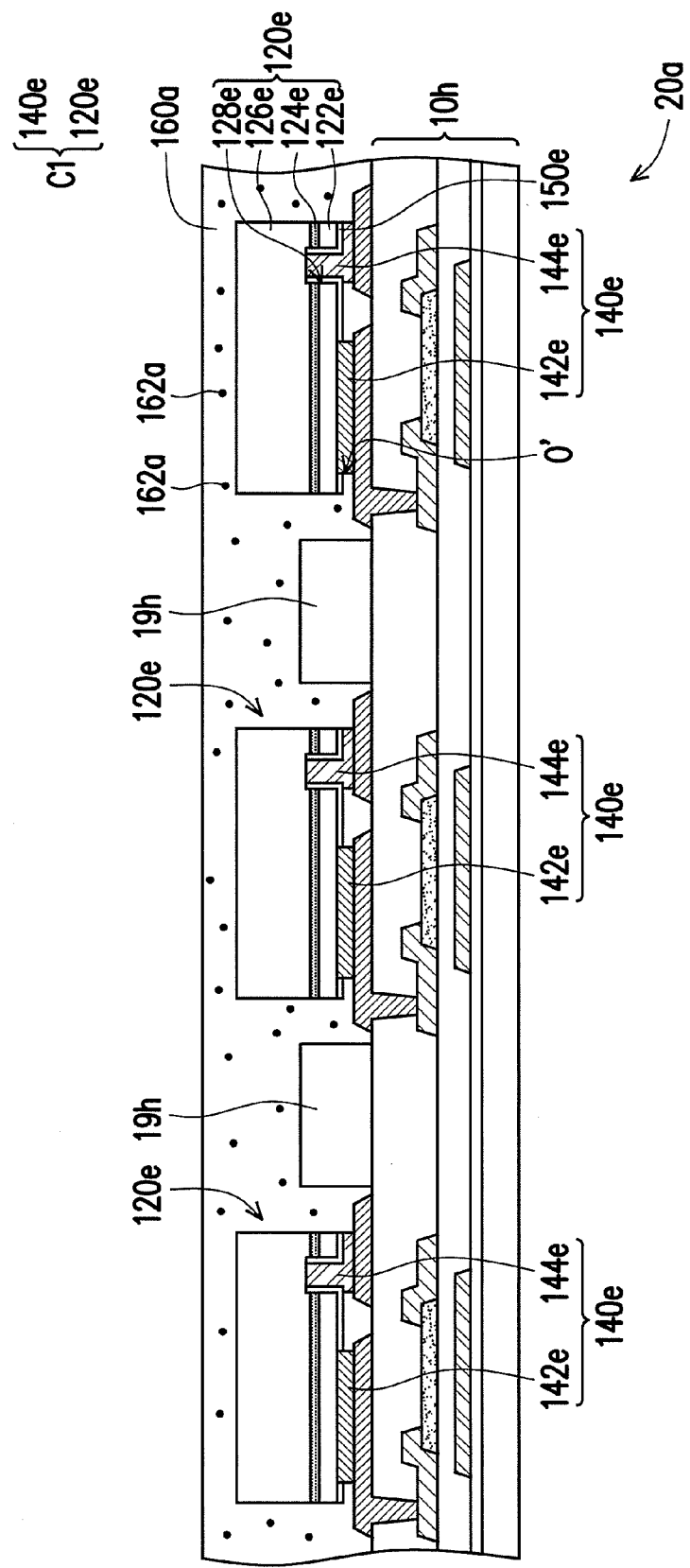
FIG. 10 is a schematic cross-sectional view illustrating a display panel according to another embodiment of the invention.

FIG. 10 is a schematic cross-sectional view illustrating a display panel according to another embodiment of the invention. Referring to FIGS. 8B and 10 together, a display panel 20a of this embodiment is similar to the display panel 20 shown in FIG. 8B, except for a main difference that the receiving substrate 10g has a plurality of light-obstructed structure 19h, and the light-obstructed structure 19h and the light emitting diode chips C1 are arranged alternately. Furthermore, the light-obstructed structures 19h are arranged around one pixel comprising 3 sub-pixels with different color (e.g. R, G, B color) in other embodiment. The light-obstructed structure 19h are disposed as light barrier to reduce a light mixing effect or improving light extracting performance. Preferably, a height of each of the light-obstructed structures 19h is higher than a position of the active layers 124*e* of the epitaxial structures 120*e*. Herein, the light-obstructed structures 19*h* may be a reflective layer or a black matrix layer, the invention is not limited thereto. Furthermore, in this embodiment, the display panel 20*a* further includes an optical adhesive layer 160*a* and a plurality of diffusion particles 162*a* dispersed in the optical adhesive layer 160*a*. The optical adhesive layer 160*a* encapsulates the light emitting diode chips C1. The optical adhesive layer 160*a*, the diffusion particles 162*a* and the light-obstructed structures 19*h* help to increase the light extraction rate, moreover, the optical adhesive layer 160*a* can protect the light emitting diode chips C1.

Figure 11:
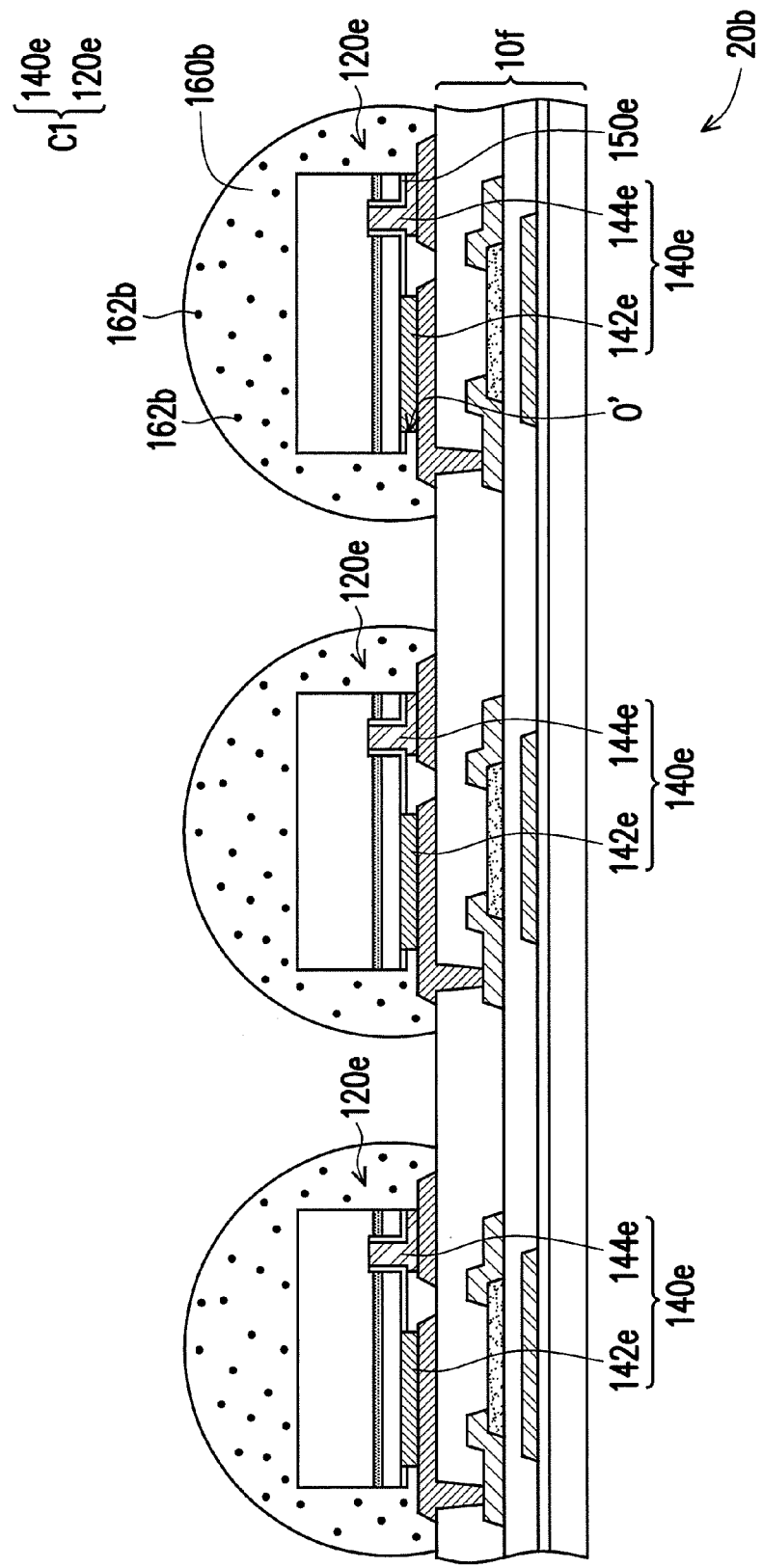
FIG. 11 is a schematic cross-sectional view illustrating a display panel according to another embodiment of the invention.

FIG. 11 is a schematic cross-sectional view illustrating a display panel according to another embodiment of the invention. Referring to FIGS. 8B and 11 together, a display panel 20*b* of this embodiment is similar to the display panel 20 shown in FIG. 8B, except for a main difference that the display panel 20*b* further includes a plurality of optical adhesive layers 160*b* and a plurality of diffusion particles 162*b* dispersed in the optical adhesive layers 160*b*. The optical adhesive layers 160*b* at least respectively encapsulate the light emitting diode chips C1 to increase the light extraction efficiency. As shown in FIG. 11, each of the optical adhesive layers 160*b* has a substantially lens-shaped structure, so that the light emission effect of the light emitting diode chips C1 can be further improved. Herein, the optical adhesive layer 160*b* can be formed by screen printing, dispersing or inkjet printing.

Figure 12:
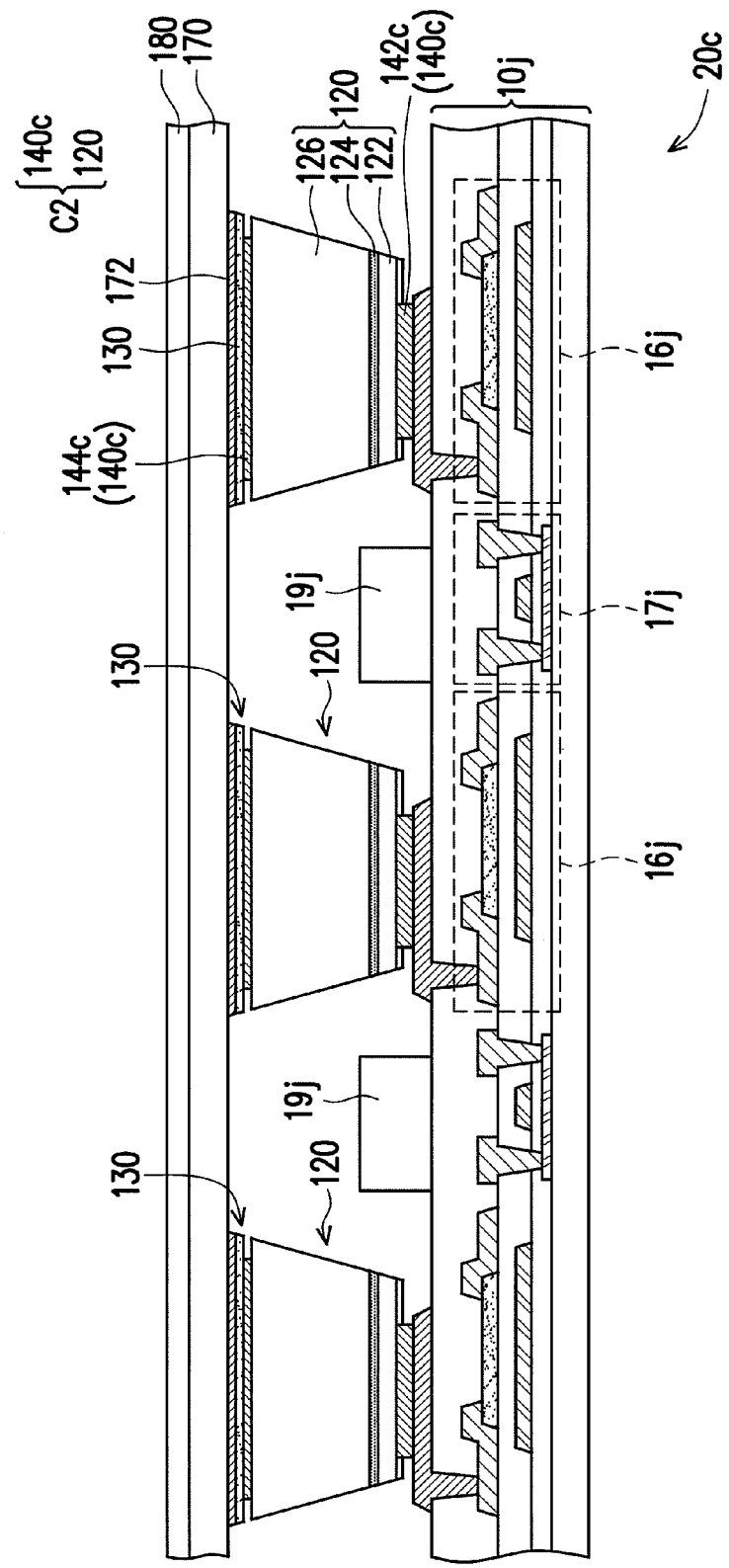
FIG. 12 is a schematic cross-sectional view illustrating a display panel according to another embodiment of the invention.

FIG. 12 is a schematic cross-sectional view illustrating a display panel according to another embodiment of the invention. Referring to FIGS. 10 and 12 together, a display panel 20*c* of this embodiment is similar to the display panel 20*a* shown in FIG. 10, except for a main difference that the first bonding pads 142*c* and the second bonding pads 144*c* are located at opposite sides of the epitaxial structures 120, respectively, so that the bonding pads 140*c* and the epitaxial structures 120 define a plurality of vertically oriented light emitting diode chips C2. The receiving substrate 10*j* has a plurality of light-obstructed structures 19*j*, and the light-obstructed structures 19*j* and the light emitting diode chips C2 are arranged alternately. The light-obstructed structures 19*j* are disposed to reduce light mixing between the two adjacent light emitting diode chips C2 of different color. Preferably, a height of each of the light-obstructed structures 19*j* is higher than a position of the active layers 124 of the epitaxial structures 120. Furthermore, the receiving substrate 10*j* also has a plurality of pixel circuits 17*j*, for example, the switch TFT, and the TFT structures 16*j*, for example, the driving TFT, are electrically connecting to control the light emitting diode chips. In addition, the display panel 20*c* further includes a cover glass 170, a plurality of electrodes 172 located between the cover glass 170 and the light emitting diode chips C2, and a light collecting layer 180 disposed on the cover glass 170 to increase the display brightness. Herein, the light collecting layer 180 in this embodiment is a brightness enhancement film (BEF) or a dual brightness enhancement film (DBEF), the invention is not limited thereto.

Figure 13:
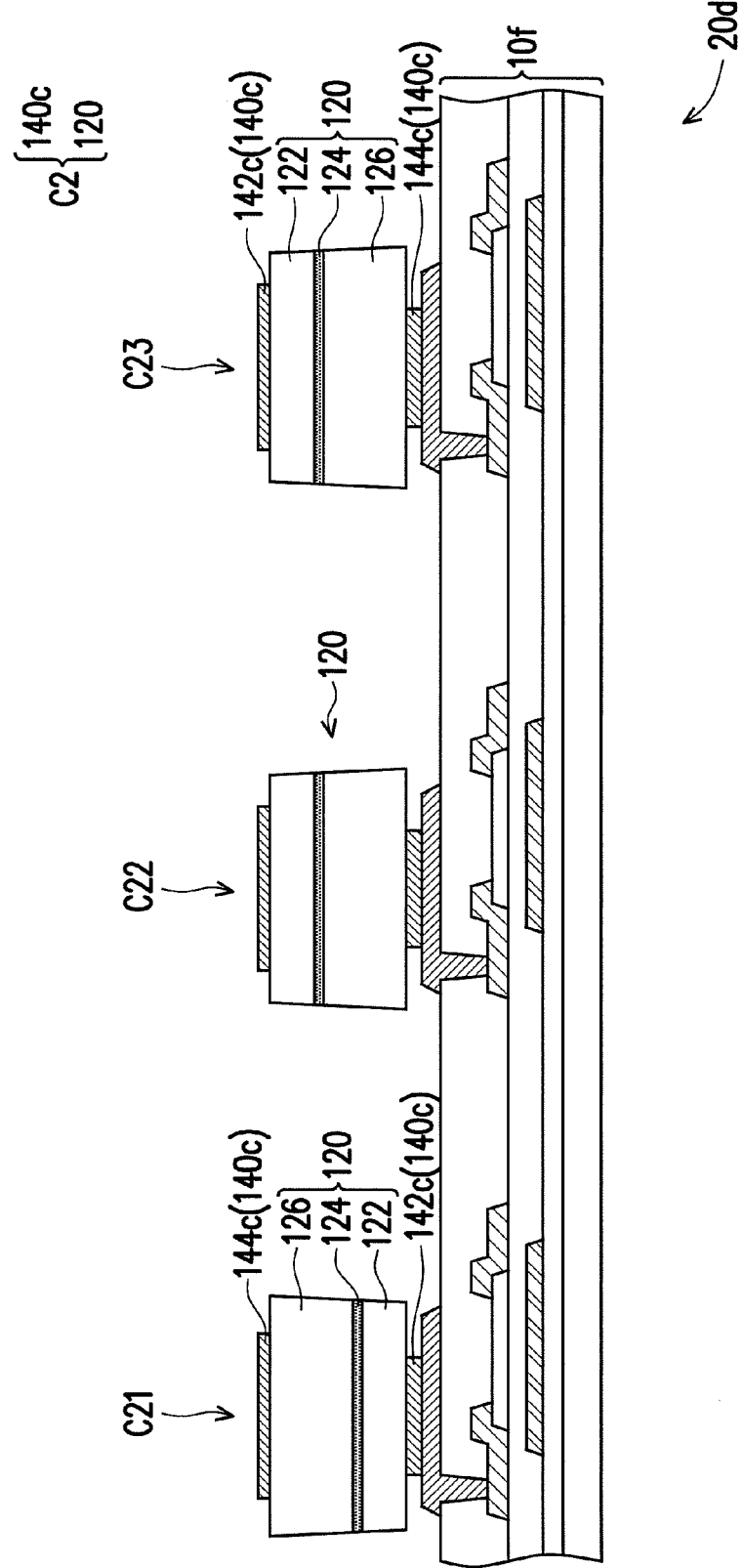
FIG. 13 is a schematic cross-sectional view illustrating a display panel according to another embodiment of the invention.

FIG. 13 is a schematic cross-sectional view illustrating a display panel according to another embodiment of the invention. Referring to FIGS. 8B and 13 together, a display panel 20*d* of this embodiment is similar to the display panel 20 shown in FIG. 8B, except for a main difference that the first bonding pads 142*c* and the second bonding pads 144*c* are located at opposite sides of the epitaxial structures 120, respectively, so that the bonding pads 140*c* and the epitaxial structures 120 define a plurality of vertically oriented light emitting diode chips C2. The vertically oriented light emitting diode chips C2 are periodically and separately disposed on the receiving substrate 10*f*, and include at least one red light emitting diode chip C21, at least one blue light emitting diode chip C22 and at least one green light emitting diode chip C23. Herein, the first type semiconductor layers 122 are P type semiconductor layer, and the second type semiconductor layers 126 are N type semiconductor layer. In the red light emitting diode chip C21, the first type semiconductor layers 122 is located between the receiving substrate 10*f* and the second type semiconductor layers 126. In the blue light emitting diode chip C22 and the green light emitting diode chip C23, the second type semiconductor layers 126 are located between the receiving substrate 10*f* and the first type semiconductor layers 122. The above design is because the growth substrate and the epitaxial material of the red light emitting diode chip C21 is different from that of the blue light emitting diode chip C22 and the green light emitting diode chip C23, the transfer process of red light emitting diode chip can be different from the blue light emitting diode chip C22 and the green light emitting diode chip C23. Moreover, in this embodiment, the red light emitting diode chips are p-side down type, the green light emitting diode chips and the blue light emitting diode chips are n-side down type, this structure design could simplify transfer process.

Figure 14A:
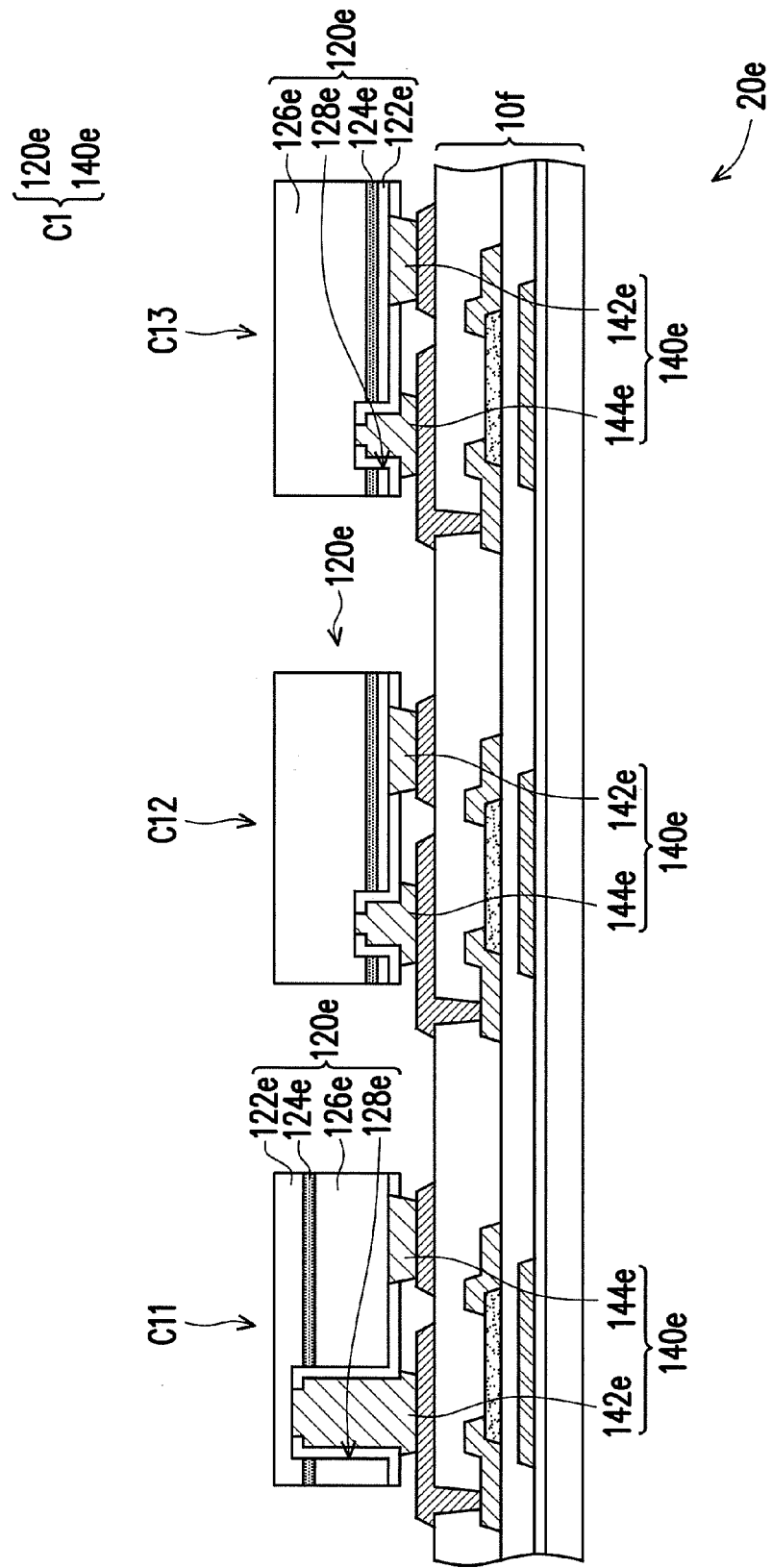
FIG. 14A is a schematic cross-sectional view illustrating a display panel according to another embodiment of the invention.

FIG. 14A is a schematic cross-sectional view illustrating a display panel according to another embodiment of the invention. Referring to FIGS. 13 and 14A together, a display panel 20*e* of this embodiment is similar to the display panel 20*d* shown in FIG. 13, except for a main difference that the epitaxial structures 120*e* and the bonding pads 140*e* define a plurality of horizontally oriented light emitting diode chips C1. The horizontally oriented light emitting diode chips C1 are periodically and separately disposed on the receiving substrate 10*f*, and include at least one red light emitting diode chip C11, at least one blue light emitting diode chip C12 and at least one green light emitting diode chip C13. Herein, the first type semiconductor layers 122*e* are P type semiconductor layer, and the second type semiconductor layers 126*e* are N type semiconductor layer. In the red light emitting diode chip C11, the second type semiconductor layers 128*e* is located between the receiving substrate 10*f* and the first type semiconductor layers 126*e*. In the green light emitting diode chip C12 and the blue light emitting diode chip C13, the first type semiconductor layers 122*e* are located between the receiving substrate 10*f* and the second type semiconductor layers 126*e*. Herein, an orthogonal projection area on the receiving substrate 10*f* of each of the first bonding pads 142*e* is the same as an orthogonal projection area on the receiving substrate 10*f* of each of the second bonding pads 144*e*.

Figure 14B:
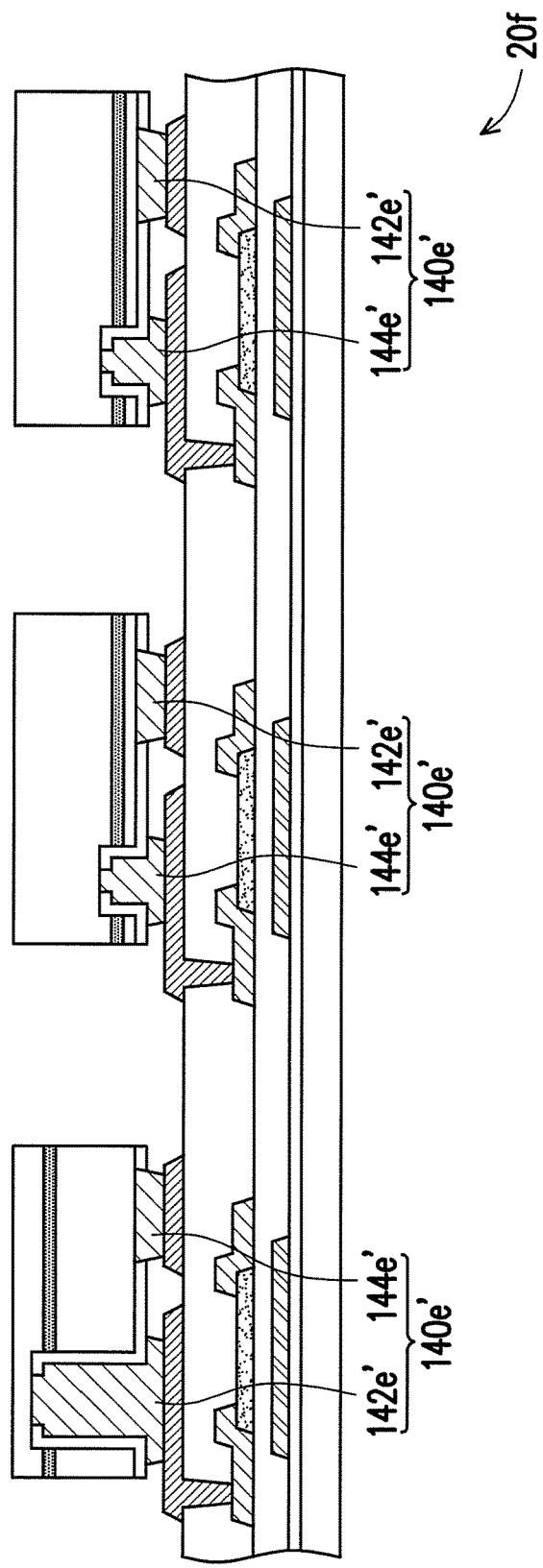
FIG. 14B is a schematic cross-sectional view illustrating a display panel according to another embodiment of the invention.

FIG. 14B is a schematic cross-sectional view illustrating a display panel according to another embodiment of the invention. Referring to FIGS. 14A and 14B together, a display panel 20*f* of this embodiment is similar to the display panel 20*e* shown in FIG. 14A, except for a main difference that the size of the first bonding pad 142*e*' of the red light emitting diode chip is different from the size of the first bonding pads 142*e*' of the greed/blue light emitting diode chips. The size of the first bonding pad 142*e*' is also different from the size of the second bonding pad 144*e*' of one light emitting diode chip. Specifically, an orthogonal projection area on the receiving substrate 10*f* of the first bonding pad 142*e*' of red light emitting diode chip is different from an orthogonal projection area on the receiving substrate 10*f* of the first bonding pad 142*e*' of the greed/blue light emitting diode chips.

In view of the foregoing, since the light emitting device according to the embodiments of the invention has the buffer pad, the buffer pad may absorb the internal stress generated during bonding when the light emitting device is subsequently thermally bonded to the receiving substrate and reduce and the movement generated when a high stress is applied to the epitaxial structure. In brief, the buffer pad may prevent the dislocation between the epitaxial structure and the receiving substrate. Thus, the structural design of the light emitting device according to the embodiments of the invention helps the subsequent thermal bonding process, and may effectively improve the structural reliability of the light emitting device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting device, comprising:
   a carrier;
   a plurality of light emitting diode chips, disposed on the carrier, wherein each light emitting diode chip comprises:
      a first type semiconductor layer;
      an active layer, disposed on the first type semiconductor layer;
      a second type semiconductor layer, disposed on the active layer;
      a via hole, sequentially penetrating through the first type semiconductor layer, the active layer and a portion of the second type semiconductor layer, wherein the first type semiconductor layer, the active layer, the second type semiconductor layer and the via hole define an epitaxial structure; and
      a plurality of bonding pads, disposed between the epitaxial structure and a receiving substrate and comprising a first bonding pad electrically connected to the first type semiconductor layer and a second bonding pad electrically connected to the second type semiconductor layer; and
   a plurality of buffer pads, located on the carrier and disposed between the carrier and the second type semiconductor layers of the epitaxial structures, wherein the buffer pads are with Young's modulus of 2~10 GPa, the second bonding pad is disposed within the via hole to contact the second type semiconductor layer, and the epitaxial structures are electrically bonded to the receiving substrate through the bonding pads,
   wherein an area of an orthogonal projection of each of the buffer pads on the carrier is 0.6 times to 1.2 times of an area of an orthogonal projection of the epitaxial structure on the carrier.

2. The light emitting device as claimed in claim 1, wherein a material of the buffer pads is organic with Young's modulus of 2.9~3.6 GPa.

3. The light emitting device as claimed in claim 2, wherein the material of the buffer pads is organic with break elongation 5~10% and residual stress 30~40 MPa.

4. The light emitting device as claimed in claim 1, wherein the receiving substrate comprises a plurality of circuit electrodes, and the bonding pads are electrically connected to the circuit electrodes.

5. The light emitting device as claimed in claim 1, wherein each light emitting diode chip further comprises:
   an insulating layer, disposed on the first type semiconductor layer and a sidewall of the via hole, wherein the insulating layer forms a contact opening to expose the first type semiconductor layer and forms another opening in the via hole to expose the second type semiconductor layer, and the first bonding pad is disposed in the contact opening, the second bonding pad is disposed in another opening, and a portion of the insulating layer is located between a side wall of the via hole and the second bonding pad.

6. The light emitting device as claimed in claim 1, wherein the receiving substrate comprises a plurality of sub-pixels, each of the epitaxial structures corresponds to one of the sub-pixels.

7. The light emitting device as claimed in claim 1, wherein the receiving substrate comprises a plurality of light-obstructed structures, and the light-obstructed structures and the light emitting diode chips are arranged alternately.

8. The light emitting device as claimed in claim 7, wherein a height of each light-obstructed structure is higher than a position of the active layer of the adjacent epitaxial structure.

9. The light emitting device as claimed in claim 1, wherein the thickness of the second type semiconductor layer is 3 times to 15 times of a thickness of the active layer, and the thickness of the second type semiconductor layer is 10 times to 20 times of the thickness of the first type semiconductor layer.

10. The light emitting device as claimed in claim 1, wherein in a vertical direction with respect to the carrier, each of the buffer pads and the epitaxial structure are conformal patterns.

11. The light emitting device as claimed in claim 1, wherein the receiving substrate comprises a thin film transistor substrate, a complementary metal oxide semiconductor substrate, a printed circuit board substrate or a flexible substrate.

12. The light emitting device as claimed in claim 1, wherein an orthogonal projection area of the first bonding pad on the receiving substrate is the same as an orthogonal projection area of the second bonding pad on the receiving substrate.

13. The light emitting device as claimed in claim 1, wherein an orthogonal projection area of the first bonding pad on the receiving substrate is different from an orthogonal projection area of the second bonding pad on the receiving substrate.

* * * * *